US012589444B2

(12) United States Patent
Cho et al.

(10) Patent No.: US 12,589,444 B2
(45) Date of Patent: Mar. 31, 2026

(54) BONDING APPARATUS AND BONDING POWER TERMINAL OF HEATING PLATE

(71) Applicant: SEMES CO., LTD., Chungcheongnam-do (KR)

(72) Inventors: Min Hee Cho, Gyeonggi-do (KR); Jun Ho Song, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 594 days.

(21) Appl. No.: 18/145,125

(22) Filed: Dec. 22, 2022

(65) Prior Publication Data

US 2023/0201942 A1 Jun. 29, 2023

(30) Foreign Application Priority Data

Dec. 28, 2021 (KR) ........................ 10-2021-0190320

(51) Int. Cl.
B23K 1/00 (2006.01)
B23K 37/04 (2006.01)
(Continued)

(52) U.S. Cl.
CPC ........ B23K 1/0016 (2013.01); B23K 37/0408 (2013.01); B25B 11/002 (2013.01); *H10P 72/0431* (2026.01); *H10P 72/7614* (2026.01)

(58) Field of Classification Search
CPC .. B23K 1/0016; B23K 37/0408; B23K 20/02; B23K 37/0443; B25B 11/002;
(Continued)

(56) References Cited

U.S. PATENT DOCUMENTS

2016/0001427 A1 * 1/2016 Evans .................. B23K 26/244
219/121.13
2016/0068288 A1 * 3/2016 Palumbo ............. B29C 65/7841
53/511
(Continued)

FOREIGN PATENT DOCUMENTS

CN 111067698 A * 4/2020 ........... A61N 5/0625
JP 2002-190370 A 7/2002
(Continued)

OTHER PUBLICATIONS

KR Office Action issued in corresponding KR Patent Application No. 10-2021-0190320, dated Sep. 19, 2023, pp. 1-7.

*Primary Examiner* — Thomas J Hong
*Assistant Examiner* — Jose K Abraham
(74) *Attorney, Agent, or Firm* — Carter, DeLuca & Farrell LLP

(57) ABSTRACT

The present invention relates to a bonding apparatus for a power terminal of a heating plate, for bonding the power terminal supplying power to a heating wire of a substrate. The bonding apparatus for a power terminal of a heating plate comprises: a chamber; a stage which is disposed in an inner space of the chamber and on which the substrate is placed; an upper press portion disposed in the inner space of the chamber to face the stage, provided to be vertically movable, and having a terminal fixing portion configured to fix the power terminal; and an elevating driver configured to move the upper press portion up and down, wherein the terminal fixing portion further includes a magnetic holder configured to hold the power terminal by a magnetic force.

17 Claims, 10 Drawing Sheets

(51) Int. Cl.
  *B25B 11/00*   (2006.01)
  *H10P 72/00*   (2026.01)
  *H10P 72/76*   (2026.01)

(58) Field of Classification Search
  CPC ........... H01L 21/67098; H01L 21/6875; H01L
      21/67109; H01L 21/67103; H01R 43/048;
           H05B 3/02; H05B 3/54
  See application file for complete search history.

(56)      References Cited

U.S. PATENT DOCUMENTS

2019/0016487 A1 * 1/2019 Capitani ........... B29C 66/91423
2020/0215781 A1 * 7/2020 Tanaka ................... F27B 17/00

FOREIGN PATENT DOCUMENTS

| | | | | |
|---|---|---|---|---|
| JP | 2005-093654 A | | 4/2005 | |
| JP | 2014-179419 A | | 9/2014 | |
| KR | 20120118968 A | * | 10/2012 | ....... H01L 21/67092 |
| KR | 10-2018-0073767 A | | 7/2018 | |
| KR | 10-2021-0062241 A | | 5/2021 | |

* cited by examiner

550

BONDING APPARATUS AND BONDING POWER TERMINAL OF HEATING PLATE

CROSS-REFERENCE TO RELATED APPLICATIONS

This application claims priority to and the benefit of Korean Patent Application No. 10-2021-0190320 filed in the Korean Intellectual Property Office on Dec. 28, 2021, the entire contents of which are incorporated herein by reference.

TECHNICAL FIELD

The present invention relates to a bonding apparatus and a bonding method for a power terminal of a heating plate.

BACKGROUND ART

In order to manufacture a semiconductor device, various processes such as photography, etching, deposition, ion implantation, and cleaning are performed. Among them, the photographic process plays an essential role in achieving high integration of semiconductor devices as a process to form a pattern.

The photographic process is largely composed of a coating process, an exposing process, and a developing process, where a baking process is carried out before advancing the exposing process after the coating process, and after advancing the exposing process. The baking process is a process of heat-treating a substrate, and serves to heat-treat the substrate placed on a heating plate using heat supplied from a heater.

In general, a resistance pattern for generating heat by applying power is supplied to a heating unit that heats a substrate, such as a heating plate. Power is transmitted to an end of the resistance pattern through a wire provided by a power terminal. In general, bonding of the power terminal is performed by a reflow process.

However, if a heater power terminal portion of the heating unit is exposed to high temperatures for a long time during operation and simultaneously has an insufficient solder melting point margin, defects such as growth of voids and intermetallic compounds may occur due to solder degradation. Specifically, the voids grow greatly in a deteriorated environment to reduce mechanical and electrical performance of bonding parts, resulting in adversely affecting long-term reliability.

SUMMARY OF THE INVENTION

The present invention has been made in an effort to provide a bonding apparatus and a bonding method for a power terminal of a heating plate which can ensure reliability of bonding parts.

The object of the present invention is not limited thereto, and other objects not mentioned will be clearly understood by those of ordinary skill in the art from the following description.

An exemplary embodiment of the present invention provides a bonding method for a power terminal of a heating plate, the method including: a step of providing an object to be bonded in which a heating wire on a lower surface of a substrate, the power terminal configured to supply power to the heating wire, and a metal paste disposed between the heating wire and the power terminal are formed; and a bonding step of sintering the object to be bonded by thermal compression, and in the bonding step, pressurization is applied with a pressing jig in an upper part and a lower part of the object to be bonded.

According to the exemplary embodiment, in the step of providing the object to be bonded, the power terminal may be attached to a magnetic holder having a magnetic force provided on an upper plate of the pressing jig.

According to the exemplary embodiment, in the bonding step, a predetermined pressurization may be applied, and after performing a first treatment at a first set temperature, a second treatment may be performed at a second set temperature different from the first set temperature.

According to the exemplary embodiment, in the bonding step, the first set temperature may be 70 to 90° C., and the second set temperature may be 290 to 310° C.

According to the exemplary embodiment, in the bonding step, the time taken for the second treatment may be longer than the time taken for the first treatment.

According to the exemplary embodiment, in the bonding step, the magnetic holder may provide a pressing force to the power terminal while being elastically supported by an elastic body on the upper plate of the pressing jig.

According to the exemplary embodiment, in the bonding step, the metal paste may include silver (Ag).

Another exemplary embodiment of the present invention provides a bonding apparatus for a power terminal of a heating plate, for bonding the power terminal supplying power to a heating wire of a substrate, the apparatus including: a chamber; a stage which is disposed in an inner space of the chamber and on which the substrate is placed; an upper press portion disposed in the inner space of the chamber to face the stage, provided to be vertically movable, and having a terminal fixing portion configured to fix the power terminal; and an elevating driver configured to move the upper press portion up and down.

According to the exemplary embodiment, in the bonding step, the terminal fixing portion may include magnetic holder that fixes the power terminal by a magnetic force.

According to the exemplary embodiment, in the bonding step, the terminal fixing portion may provide a pressing force to the power terminal in a state in which the magnetic holder is elastically supported by the upper press portion.

According to the exemplary embodiment, in the bonding step, the terminal, the terminal fixing portion includes an elastic body that elastically supports the magnetic holder.

According to the exemplary embodiment, in the bonding step, the stage and the upper press portion may further include a heating member.

According to the exemplary embodiment, the bonding apparatus for a power terminal of a heating plate may further include a controller configured to control the heating member, and the controller may control the heating member so as to perform a first treatment at the first set temperature and then a second treatment at the second set temperature different from the first set temperature while the power terminal is thermally compressed to the heating wire by the press portion.

According to the exemplary embodiment, the first set temperature may be 70 to 90° C., and the second set temperature may be 290 to 310° C.

According to the exemplary embodiment, the bonding apparatus for a power terminal of a heating plate may further include a guide member configured to guide a vertical movement of the upper press portion.

According to the exemplary embodiment, the guide member may include: guide rods fixed and installed vertically in the inner space of the chamber; and a moving plate fixedly installed on an upper surface of the upper press portion and provided to be movable along the guide rods.

Still another exemplary embodiment of the present invention provides a bonding apparatus for a power terminal of a heating plate, for bonding the power terminal supplying power to a heating wire of a substrate, the apparatus including: a chamber; a stage which is disposed in an inner space of the chamber and on which the substrate is placed; an upper press portion disposed in the inner space of the chamber to face the stage, provided to be vertically movable, and having a terminal fixing portion configured to fix the power terminal; a guide member configured to guide a vertical movement of the upper press portion; and an elevating driver configured to move the upper press portion up and down, and the terminal fixing portion further includes a magnetic holder configured to hold the power terminal by a magnetic force.

According to the exemplary embodiment, the terminal fixing portion may include an elastic body that elastically supports the magnetic holder in the upper press portion.

According to the exemplary embodiment, the stage and the upper press portion may further include a heating member.

According to the exemplary embodiment, the bonding apparatus for a power terminal of a heating plate may further include a controller configured to control the heating member, and the controller may control the heating member so as to perform a first treatment at a first set temperature and then a second treatment at a second set temperature different from the first set temperature while the power terminal is thermally compressed to the heating wire by the press portion.

According to the exemplary embodiment of the present invention, a heating unit can prevent oxidation of a solder.

In addition, according to the exemplary embodiment of the present invention, the heating unit may extend the life cycle of solder.

In addition, according to the exemplary embodiment of the present invention, the heating unit may prevent a short circuit due to a terminal connection.

The effect of the present invention is not limited to the foregoing effects, and those skilled in the art may clearly understand non-mentioned effects from the present specification and the accompanying drawings.

DETAILED DESCRIPTION

Figure 1:
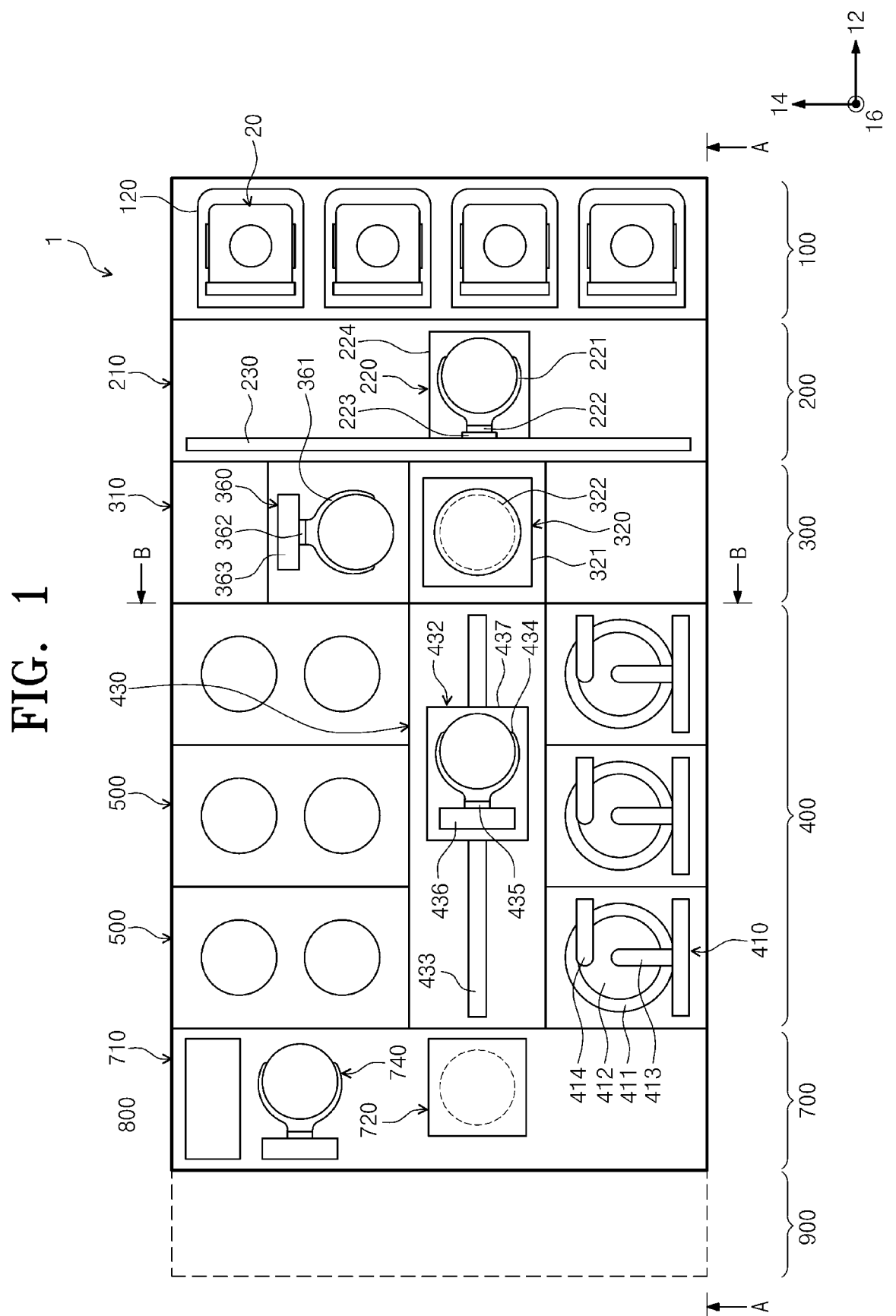
FIG. 1 is a view of a substrate treating apparatus when viewed from the top.

Hereinafter, exemplary embodiments of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Figure 2:
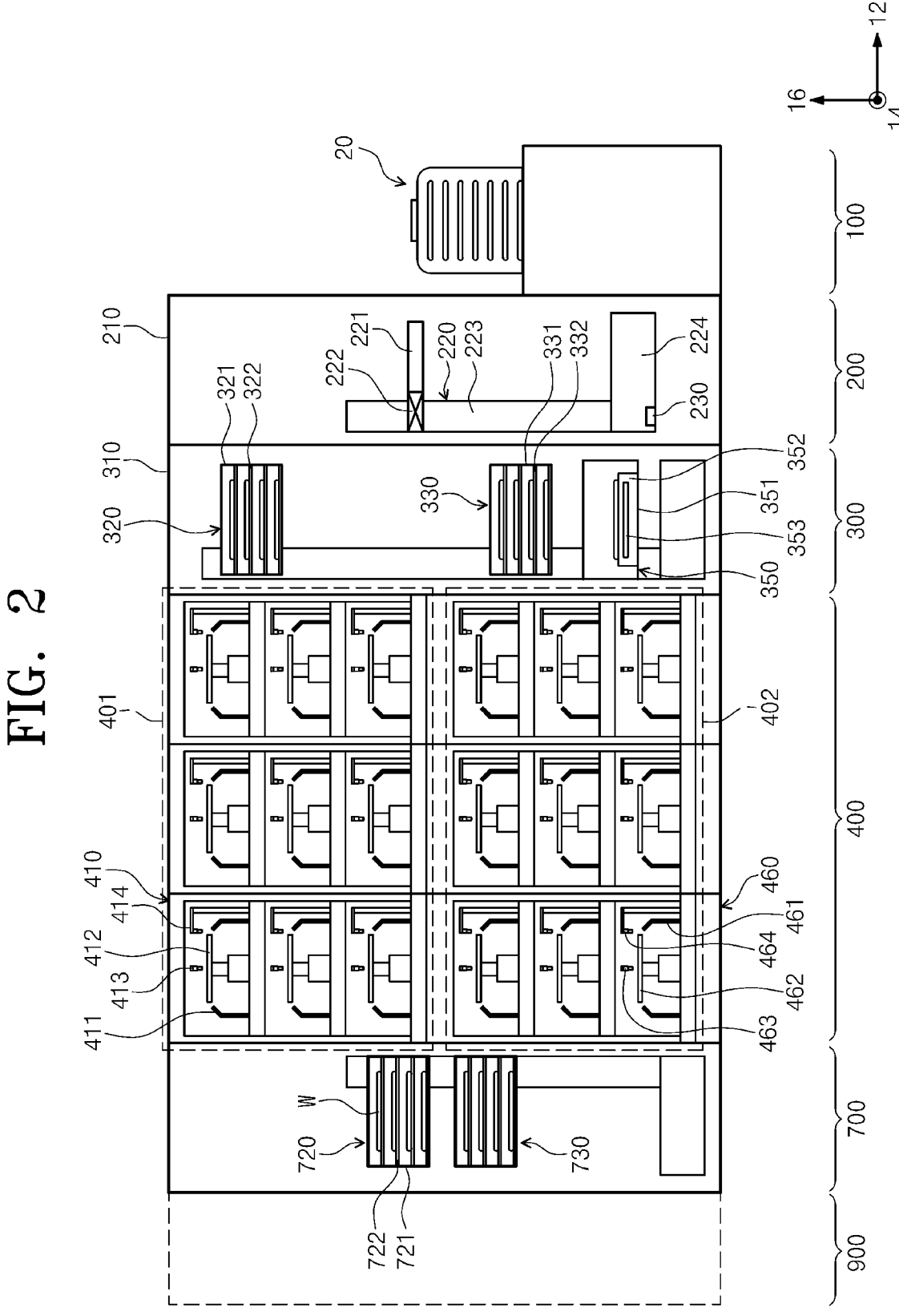
FIG. 2 is a view of the apparatus of FIG. 1 when viewed in the A-A direction.
Figure 3:
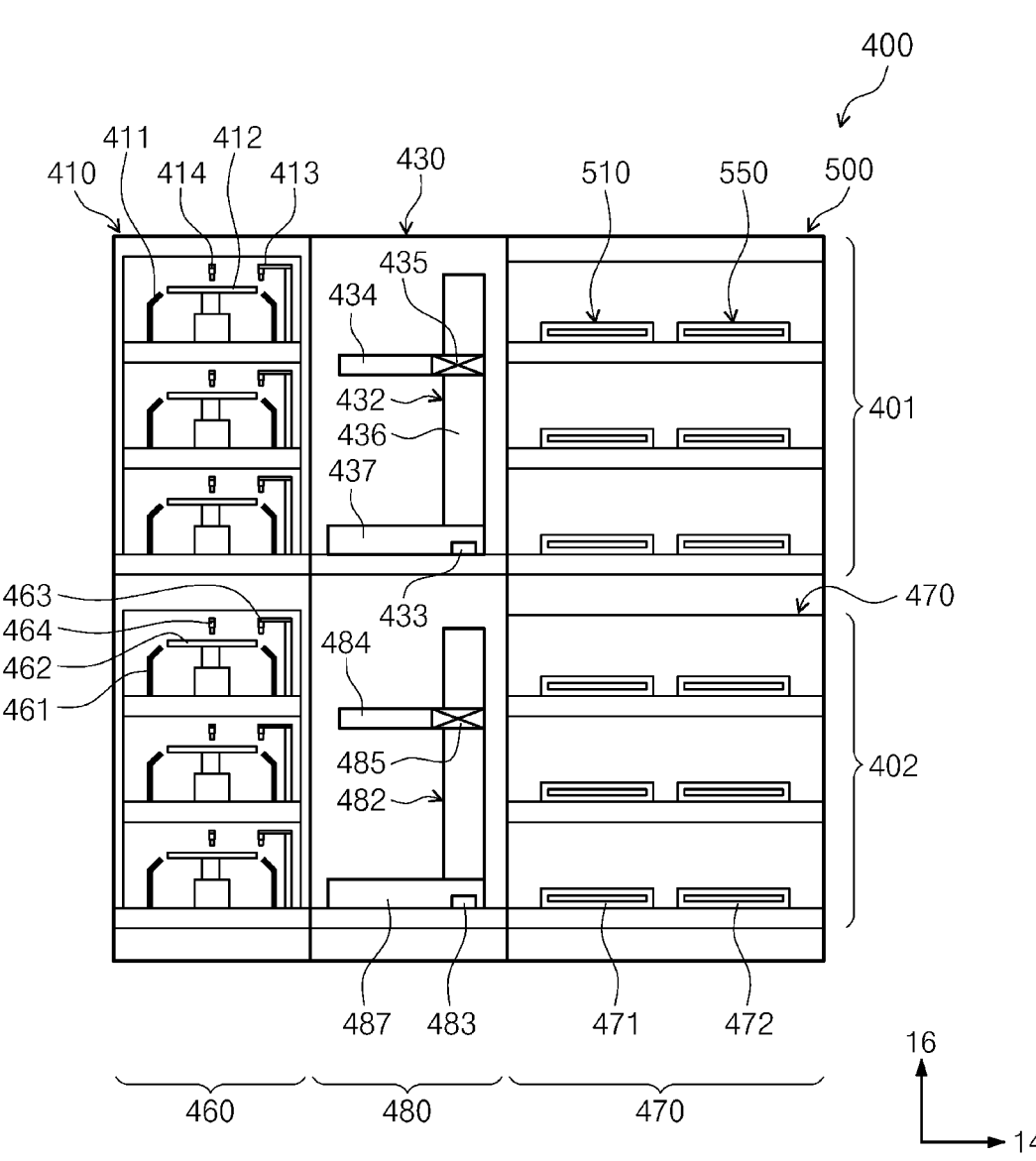
FIG. 3 is a view of the substrate treating apparatus of FIG. 1 when viewed in the B-B direction.

FIGS. 1 to 3 are view schematically illustrating a substrate treating apparatus 1 according to one embodiment of the present invention. FIG. 1 is a view of the substrate treating apparatus when viewed from the top, FIG. 2 is a view of the apparatus 1 of FIG. 1 when viewed in the A-A direction, and FIG. 3 is a view of the substrate treating apparatus 1 of FIG. 1 when viewed in the B-B direction.

Referring to FIGS. 1 to 3, the substrate treating apparatus 1 includes a load port 100, an index module 200, a buffer module 300, a coating and developing module 400, an interface module 700, and a purge module 800. The load port 100, the index module 200, the buffer module 300, the coating and developing module 400, and the interface module 700 are sequentially arranged in a line in one direction.

Hereinafter, the direction in which the load port 100, the index module 200, the buffer module 300, the coating and developing module 400, and the interface module 700 are arranged is referred to as a first direction 12. When viewed from the top, a direction perpendicular to the first direction 12 is referred to as a second direction 14, and a direction perpendicular to the first direction 12 and the second direction 14 is referred to as a third direction 16.

A wafer W is moved while being accommodated in a cassette 20. The cassette 20 has a structure that may be sealed from the outside. For example, a front open unified pod (FOUP) having a door in front may be used as the cassette 20.

Hereinafter, the load port 100, the index module 200, the buffer module 300, the coating and developing module 400, the interface module 700, and the purge module 800 will be described.

The load port 100 has a mounting table 120 on which the cassette 20 having the wafers W accommodated therein is placed. A plurality of mounting tables 120 are provided, and the mounting tables 120 are arranged in a line along the second direction 14. In FIG. 1, four mounting tables 120 are provided.

The index module 200 transfers the wafer W between the cassette 20 placed on the mounting table 120 of the load port 100 and the buffer module 300. The index module 200 includes a frame 210, an index robot 220, and a guide rail 230. The frame 210 is provided in a substantially rectangular parallelepiped shape with a hollow interior, and is disposed between the load port 100 and the buffer module 300. The frame 210 of the index module 200 may be provided at a height lower than that of the frame 310 of the buffer module 300 described below. The index robot 220 and the guide rail 230 are disposed in the frame 210. The index robot 220 has a structure capable of a four-axis drive so that the hand 221 directly handling the wafer W can be moved and rotated in the first direction 12, the second direction 14, and the third direction 16. The index robot 220 includes a hand 221, an arm 222, a support 223, and a strut 224. The hand 221 is fixedly installed on the arm 222. The arm 222 is provided in a stretchable structure and a rotatable structure. A longitudinal direction of the support 223 is disposed along the third direction 16. The arm 222 is coupled to the support 223 to be movable along the support 223. The support 223 is fixedly coupled to the support 224. A longitudinal direction of the guide rail 230 is disposed along the second direction 14. The strut 224 is coupled to the guide rail 230 so as to be movable linearly along the guide rail 230. In addition, although not illustrated, a door opener for opening and closing the door of the cassette 20 is further provided in the frame 210.

The buffer module 300 includes a frame 310, a first buffer 320, a second buffer 330, a cooling chamber 350, and a first buffer robot 360.

The frame 310 is provided in the rectangular parallelepiped shape with a hollow interior, and is disposed between the index module 200 and the coating and developing module 400. The first buffer 320, the second buffer 330, the cooling chamber 350, and the first buffer robot 360 are disposed in the frame 310. The cooling chamber 350, the second buffer 330, and the first buffer 320 are sequentially disposed in the third direction 16 from below. The first buffer 320 is disposed at a height corresponding to a coating module 401 of the coating and developing module 400, which will be described below, and the second buffer 330 and the cooling chamber 350 are provided at a height corresponding to a developing module 402 of the coating and developing module 400, which will be described below. The first buffer robot 360 is spaced apart from the second buffer 330, the cooling chamber 350, and the first buffer 320 by a predetermined distance.

Each of the first buffer 320 and the second buffer 330 temporarily stores a plurality of wafers W. The second buffer 330 includes a housing 331 and a plurality of supports 332. The supports 332 are disposed in the housing 331 and are spaced apart from each other along the third direction 16. One wafer W is placed on each of supports 332. The housing 331 has an opening (not illustrated) in a direction in which the index robot 220 is provided and in a direction in which the first buffer robot 360 is provided such that the index robot 220 and the first buffer robot 360 can load or unloaded the wafer W in/from the support 332 in the housing 331. The first buffer 320 has a structure substantially similar to that of the second buffer 330. However, the housing 321 of the first buffer 320 has an opening in the direction in which the first buffer robot 360 is provided and in the direction in which a coating part robot 432 disposed in the coating module 401 is provided. The number of supports 322 provided in the first buffer 320 may be identical to or different from the number of supports 332 provided in the second buffer 330. According to the exemplary embodiment, the number of supports 332 provided in the second buffer 330 may be greater than the number of supports 322 provided in the first buffer 320.

The first buffer robot 360 transfers the wafer W between the first buffer 320 and the second buffer 330. The first buffer robot 360 includes a hand 361, an arm 362, and a support 363. The hand 361 is fixedly installed on the arm 362. The arm 362 is provided in a stretchable structure so that the hand 361 can move along the second direction 14. The arm 362 is coupled to the support 363 so as to be linearly movable in the third direction 16 along the support 363. The support 363 has a length extending from a position corresponding to the second buffer 330 to a position corresponding to the first buffer 320. The support 363 may be provided longer than the length in an upward or downward direction. The first buffer robot 360 may be provided such that the hand 361 makes only a two-axis drive along the second direction 14 and the third direction 16.

The cooling chambers 350 cools each of the wafers W. The cooling chamber 350 includes a housing 351 and a cooling plate 352. The cooling plate 352 has an upper surface on which the wafer W is placed and a cooling means 353 for cooling the wafer W. As the cooling means 353, a variety of ways of performing a cooling treatment by cooling water or performing a cooling treatment using a thermoelectric element may be used. In addition, the cooling chamber 350 may be provided with a lift pin assembly for positioning the wafer W on the cooling plate 352. The housing 351 has an opening in a direction in which the index robot 220 is provided and in a direction in which a developing part's robot is provided such that the index robot 220 and the developing part's robot provided in the developing module 402 can load or unload the wafer W in/from the cooling plate 352. In addition, doors that open or close the above-described openings may be provided in the cooling chamber 350.

The coating module 401 includes a process of coating the wafer W with a photosensitive liquid such as a photoresist and a heat treatment process of performing heating and cooling treatments on the wafer W before and after the resist coating process.

The coating module 401 includes a resist coating chamber 410, a heat treatment chamber 500, and a transfer chamber 430. The resist coating chamber 410, the heat treatment chamber 500, and the transfer chamber 430 may be sequentially disposed in the second direction 14. A plurality of resist coating chambers 410 are provided, and the plurality of resist coating chambers 410 are provided in the first direction 12 and the third direction 16, respectively. A plurality of heat treatment chambers 500 are provided in the first direction 12 and the third direction 16, respectively.

The transfer chamber 430 is disposed in parallel with the first buffer 320 of the first buffer module 300 in the first direction 12. The coating part robot 432 and the guide rail 433 are disposed in the transfer chamber 430. The transfer chamber 430 has a substantially rectangular shape. The coating part robot 432 transfers the wafer W between the bake chambers 420, the resist coating chambers 410, and the first buffer 320 of the first buffer module 300. A longitudinal direction of the guide rail 433 is disposed parallel to the first direction 12. The guide rail 433 guides the coating part robot 432 to move linearly in the first direction 12. The coating part robot 432 has a hand 434, an arm 435, a support 436, and a strut 437. The hand 434 is fixedly installed in the arm 435. The arm 435 is provided in a stretchable structure such that the hand 434 may move in a horizontal direction. A longitudinal direction of the support 436 is disposed along the third direction 16. The arm 435 is coupled to the support 436 so as to move linearly in the third direction 16 along the support 436. The support 436 is fixedly coupled to the strut 437, and the strut 437 is coupled to the guide rail 433 to be movable along the guide rail 433.

All of the resist coating chambers 410 have the same structure. However, the types of photoresists used in each of the resist coating chambers 410 may be different from each other. For example, a chemical amplification resist may be used as the photoresist. The resist coating chamber 410 coats the wafer W with the photoresist. The resist coating chamber 410 has a housing 411, a support plate 412, and a nozzle 413. The housing 411 has a cup shape of which the upper part is open. The support plate 412 is disposed in the housing 411 and supports the wafer W. The support plate 412 is rotatably provided. The nozzle 413 supplies the photoresist to the wafer W placed on the support plate 412. The nozzle 413 has a circular tubular shape and may supply the photoresist to the center of the wafer W. Alternatively, the nozzle 413 has a length corresponding to the diameter of the wafer W, and a discharge port of the nozzle 413 may be provided as a slit. In addition, the resist coating chamber 410 may further be provided with a nozzle 414 supplying a cleaning liquid such as deionized water to clean a surface of the wafer W to which the photoresist is applied.

The heat treatment chamber 500 heat-treats the wafer W. For example, before applying the photoresist, the heat treatment chambers 500 perform a pre-baking process of removing organic matter or moisture from the surface of the wafer W by heating the wafer W to a prescribed temperature before applying the photoresist or a soft baking process performed after coating the wafer W with the photoresist, and perform a cooling process of cooling the wafer W after each of the heating processes.

The heat treatment chamber 500 may include a cooling plate 510 and a heating plate 550. The cooling plate 510 is provided with a cooling means such as cooling water or a thermoelectric element. In addition, the heating plate 550 may be provided with a heating means such as a heating wire or a thermoelectric element. Some of the heat treatment chambers 500 may include only the cooling plate 510, and the other heat treatment chambers 500 include only the heating plate 550. Optionally, the cooling plate 510 and the heating plate 550 may be provided in one heat treatment chamber 500.

The developing module 402 includes a developing process of removing a part of the photoresist by supplying a developer to the wafer W to obtain a pattern, and a heat treatment process such as heating and cooling treatments performed on the wafer W before and after the developing process. The developing module 402 has a developing chamber 460, a bake chamber 470, and a transfer chamber 480. The developing chamber 460, the bake chamber 470, and the transfer chamber 480 are sequentially disposed in the second direction 14. Accordingly, the developing chamber 460 and the bake chamber 470 are spaced apart from each other in the second direction 14 with the transfer chamber 480 interposed therebetween. A plurality of developing chambers 460 are provided, and the plurality of developing chambers 460 are provided in the first direction 12 and the third direction 16, respectively.

The transfer chamber 480 is disposed in parallel with the second buffer 330 of the first buffer module 300 in the first direction 12. A developing part's robot 482 and a guide rail 483 are disposed in the transfer chamber 480. The transfer chamber 480 has a substantially rectangular shape. The developing part's robot 482 transfers the wafer W between the bake chambers 470, the developing chambers 460, and the second buffer 330 and the cooling chamber 350 of the first buffer module 300. A longitudinal direction of the guide rail 483 is disposed parallel to the first direction 12. The guide rail 483 guides the developing part's robot 482 to move linearly in the first direction 12. The developing part's robot 482 has a hand 484, an arm 485, a support 486, and a strut 487. The hand 484 is fixedly installed in the arm 485. The arm 485 is provided in a stretchable structure such that the hand 484 may move in a horizontal direction. A longitudinal direction of the support 486 is disposed along the third direction 16. The arm 485 is coupled to the support 486 so as to move linearly in the third direction 16 along the support 486. The support 486 is fixedly coupled to the support 487. The strut 487 is coupled to the guide rail 483 to be movable along the guide rail 483.

All of the developing chambers 460 have the same structure. However, the types of developers used in each of developing chamber 460 may be different from each other. The developing chamber 460 removes a light-irradiated region of the photoresist on the wafer W. In this case, a region of a protective film to which light is irradiated is also removed. Depending on the type of photoresists optionally used, only a region to which light is not irradiated may be removed from regions of the photoresist and the protective film.

The developing chamber 460 has a housing 461, a support plate 462, and a nozzle 463. The housing 461 has a cup shape of which the upper part is open. The support plate 462 is disposed in the housing 461 and supports the wafer W. The support plate 462 is rotatably provided. The nozzle 463 supplies a developer to the wafer W placed on the support plate 462. The nozzle 463 has a circular tubular shape and may supply the developer to the center of the wafer W. Optionally, the nozzle 463 has a length corresponding to the diameter of the wafer W, and a discharge port of the nozzle 463 may be provided as a slit. In addition, the developing chamber 460 may further be provided with a nozzle 464 supplying a cleaning liquid such as deionized water to clean the surface of the wafer W to which the developer is additionally supplied.

The bake chamber 470 heat-treats the wafer W. For example, the bake chambers 470 perform a post-baking process of heating the wafer W before performing the developing process and a hard baking process of heating the wafer W after performing the developing process, and a cooling process of cooling the wafer after each of baking processes.

As described above, in the coating and developing module 400, the coating module 401 and the developing module 402 are separated from each other. Further, when viewed from the top, the coating module 401 and the developing module 402 may have the same chamber arrangement.

The interface module 700 transfers the wafer W. The interface module 700 includes a frame 710, a first buffer 720, a second buffer 730, and an interface robot 740. The first buffer 720, the second buffer 730, and the interface robot 740 are disposed in the frame 710. The first buffer 720 and the second buffer 730 are spaced apart from each other by a predetermined distance and are stacked on each other. The first buffer 720 is disposed higher than the second buffer 730.

The interface robot 740 is spaced apart from the first buffer 720 and the second buffer 730 in the second direction 14. The interface robot 740 transfers the wafer W between the first buffer 720, the second buffer 730, and an exposing device 900.

The first buffer 720 temporarily stores the wafers W on which the process has been performed before moving to the exposing device 900. Further, the second buffer 730 temporarily stores the wafers W on which the process is completed before the wafers W are moved in the exposing device 900. The first buffer 720 includes a housing 721 and a plurality of supports 722. The supports 722 are disposed in the housing 721 and are spaced apart from each other in the third direction 16. One wafer W is placed on each support 722. The housing 721 has an opening in a direction in which the interface robot 740 is provided and in a direction in which a pretreatment robot 632 is provided such that the wafer W can loaded or unloaded in/from the support 722 into the housing 721. The second buffer 730 has a structure similar to that of the first buffer 720. Only buffers and robots may be provided to the interface module, as described above, without providing a chamber performing a predetermined process on the wafer.

Figure 4A:
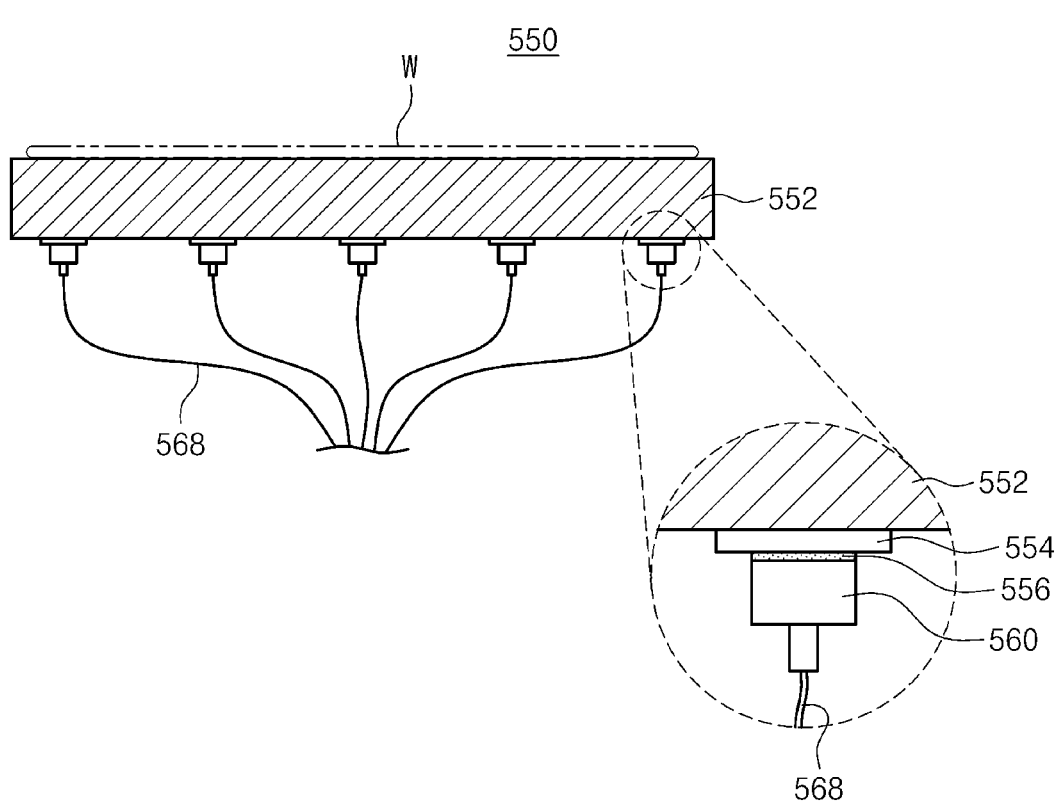
FIGS. 4A and 4B are views illustrating a heating plate of FIG. 2.
Figure 4B:
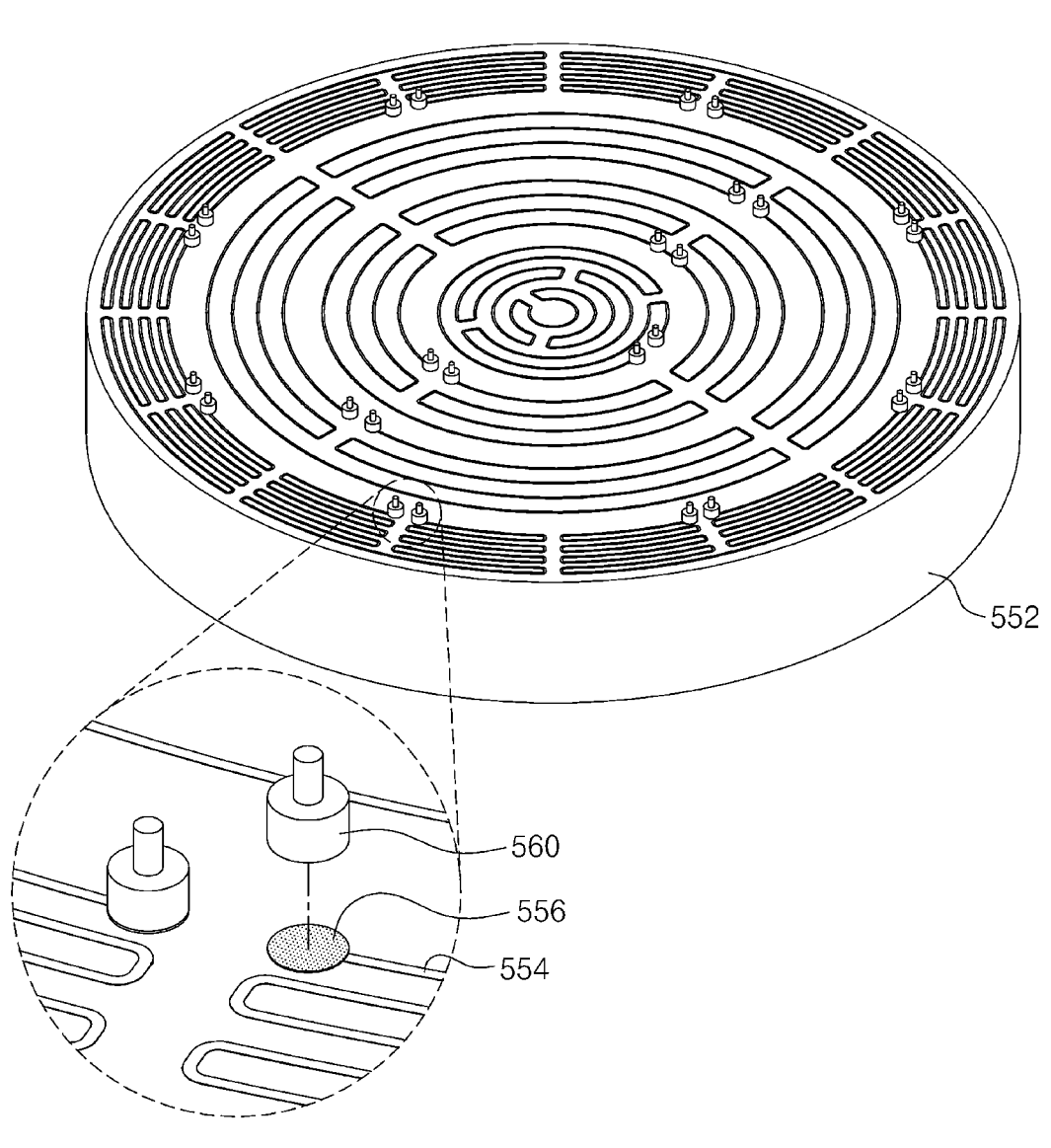

FIGS. 4A and 4B are views illustrating the heating plate of FIG. 2.

Referring to FIGS. 4A and 4B, the heating plate 550 includes a support plate 552 supporting a substrate, a heating member 554, and a power terminal 560.

The substrate is placed on the support plate 552. The support plate 552 may be provided in a circular plate shape. The heating member 554 includes a resistor that can generate heat by supplying power. Here, the resistor may include aluminum nitride (AlN). The heating member 554 may be provided on a bottom surface of the support plate 552 in a pattern shape. For example, each of heating members 554 is disposed on the same plane. Each of the heating member 554 heats different regions of the support plate 552. Regions of the support plate 552 corresponding to each of the heating members 554 are implemented with heating zones. For example, there may be five heating zones. Power terminals 560 are provided in each of the heating members 554. Bonding between the power terminal 560 and the heating member 554 is performed through a thermal compression way after applying a bonding material (i.e., an Ag paste) for low-temperature sintering between the power terminal 560 and the heating member 554. Devices used in the bonding process of the power terminal will be described in detail below.

The power terminal 560 connects the heating member 554 and a cable 568. The power terminal 560 applies power to the heating member 554. The power terminal 560 is bonded to a terminal pad 555 of the heating member 554. A metal paste 556, which is a bonding material (i.e., the Ag paste) for low-temperature sintering, is applied to the terminal pad 555. The power terminal 560 may be provided in a cylindrical shape.

Figure 5:
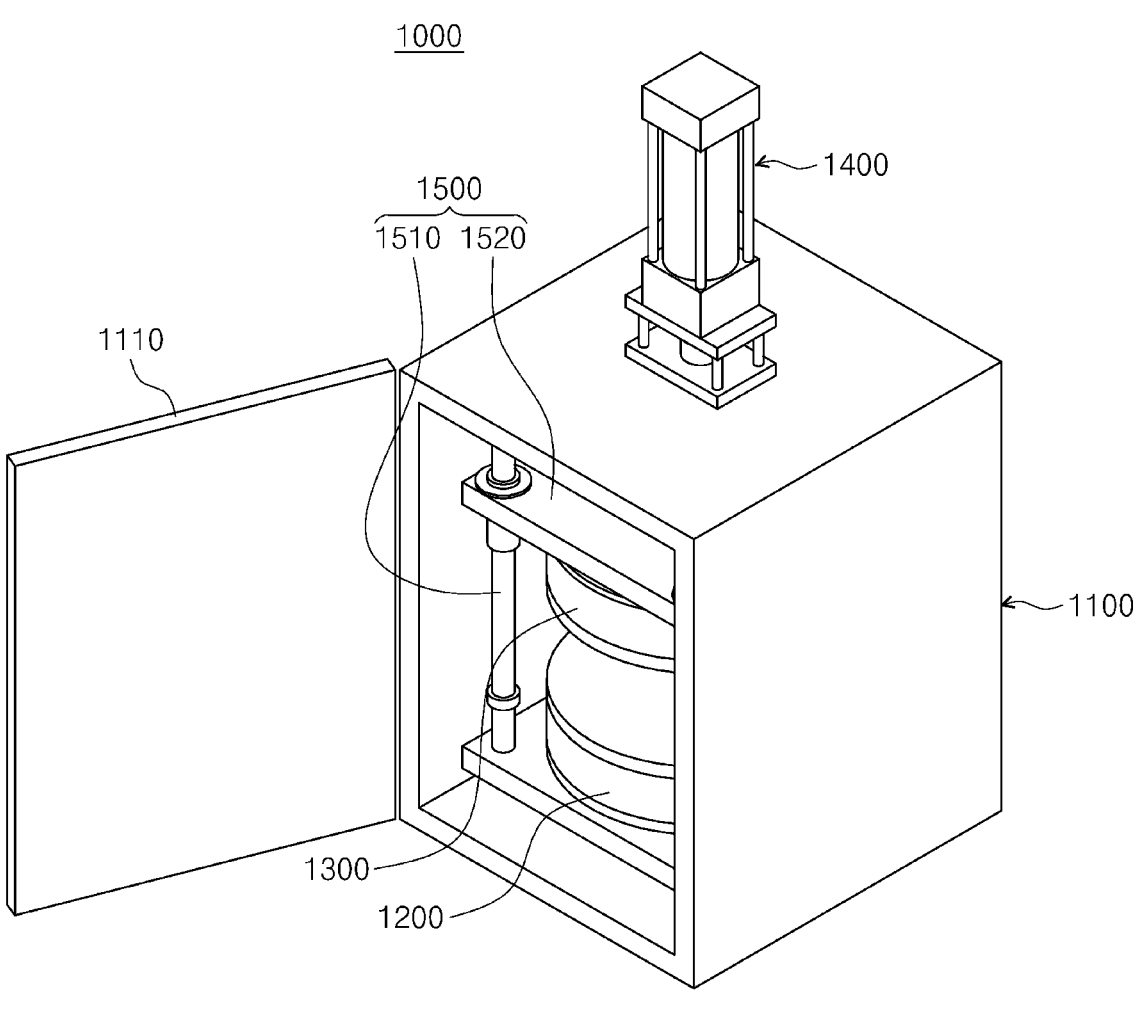
FIG. 5 is a perspective view illustrating a bonding apparatus for a power terminal used to bond a power terminal of the heating plate.
Figure 6:
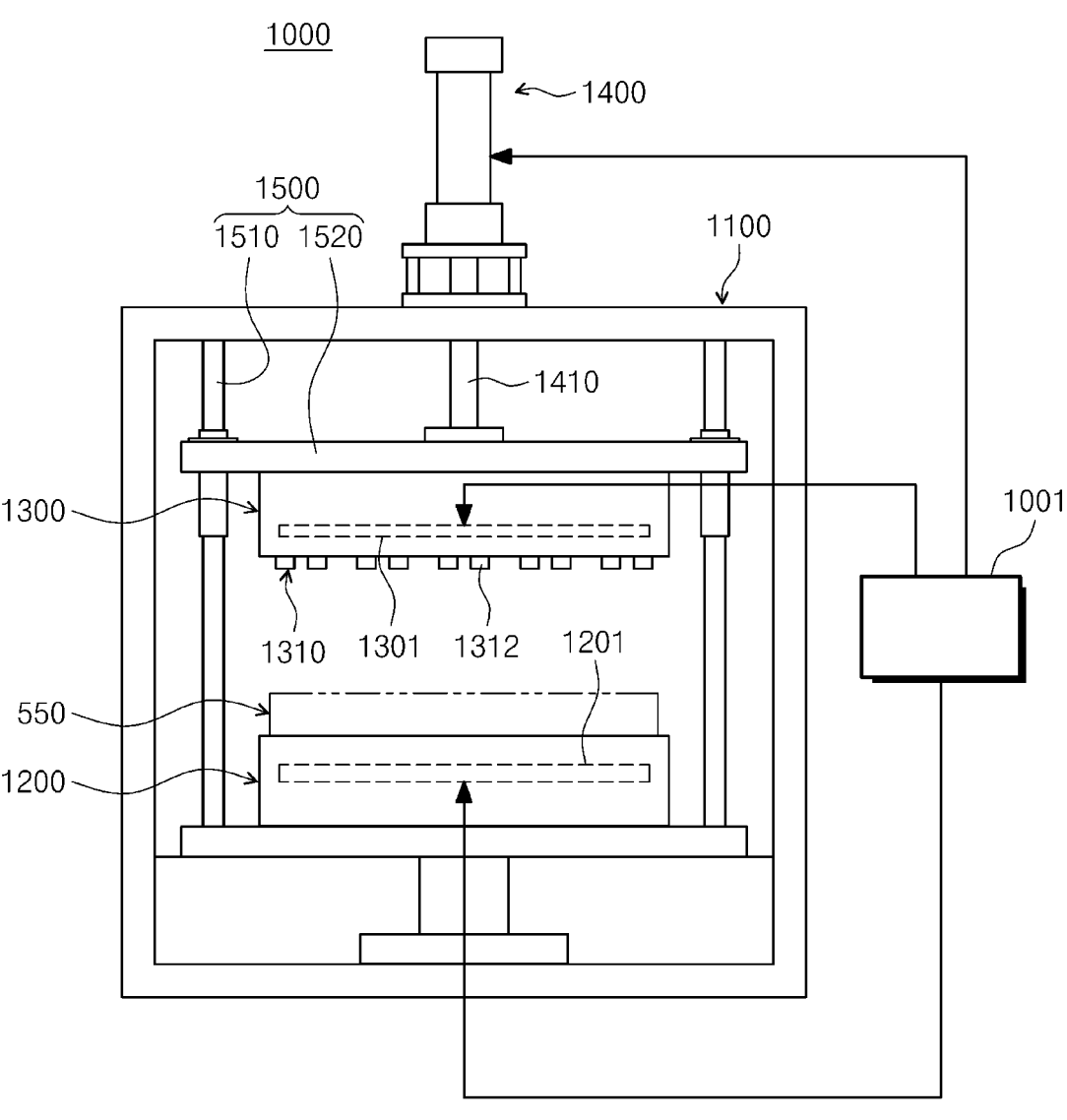
FIG. 6 is a front view of the bonding apparatus for a power terminal illustrated in FIG. 5.

FIG. 5 is a perspective view illustrating a bonding apparatus for a power terminal used to bond a power terminal of the heating plate, and FIG. 6 is a front view of the bonding apparatus for a power terminal illustrated in FIG. 5.

Referring to FIGS. 5 and 6, the bonding apparatus 1000 for a power terminal may include a chamber 1100, a stage 1200, an upper press portion 1300, and an elevating driver 1400.

The chamber 1100 has an inner space. A door 1110 capable of opening or closing is provided on a front surface of the chamber 1100. The chamber 1100 may provide an environment in a normal pressure state or a vacuum state during a bonding process of the power terminal.

The stage 1200 is disposed in the inner space of the chamber 1100. The heating plate 550 for bonding a power terminal is disposed on an upper surface of the stage 1200. In this case, the heating plate 550 is placed on the stage 1200 such that the heating member 554 as a resistor faces upwardly. The stage 1200 may include a heater 1201. During the bonding process, the stage 1200 may be heated to a preset temperature.

Figure 7:
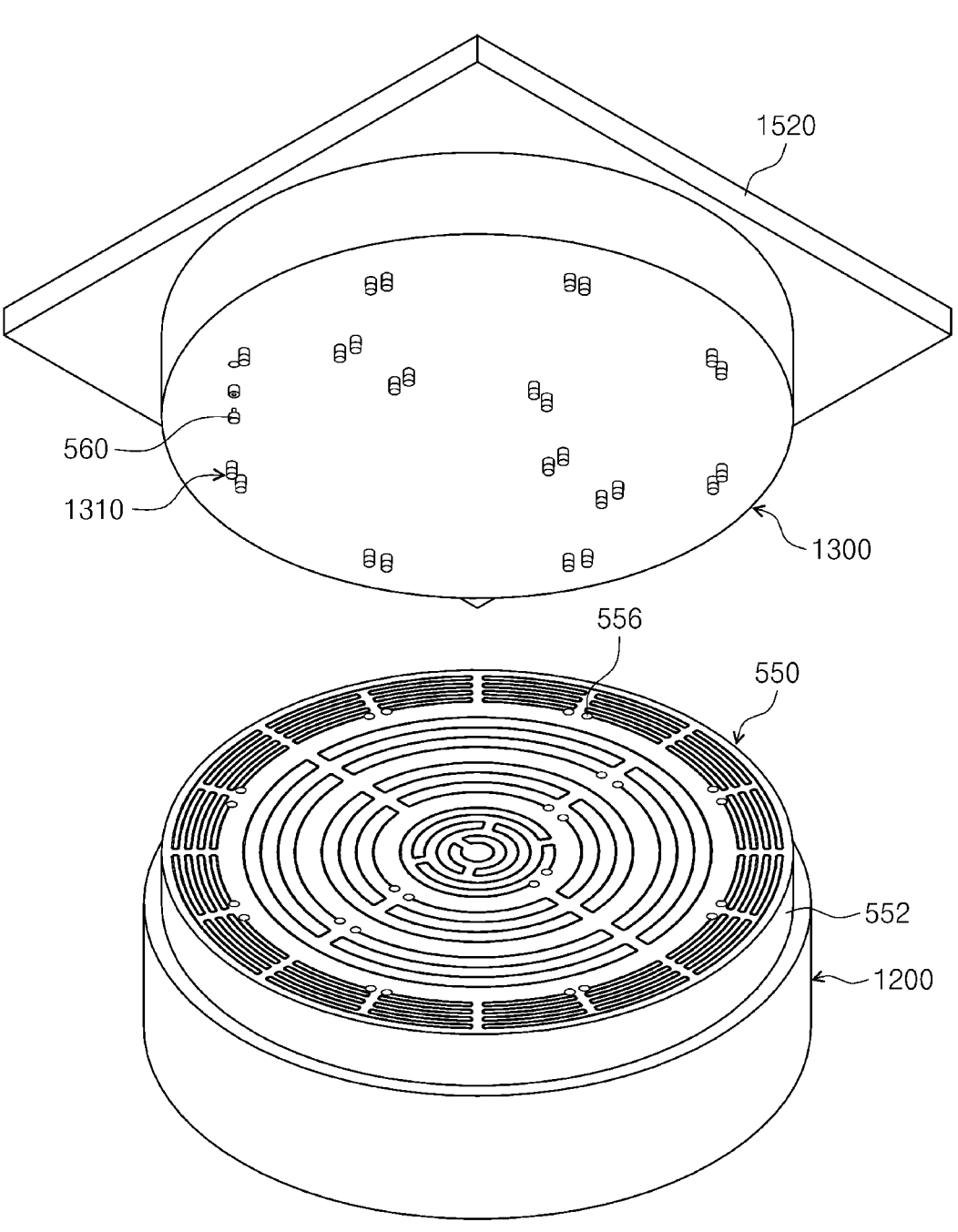
FIG. 7 is a view for explaining an upper press portion.
Figure 8:
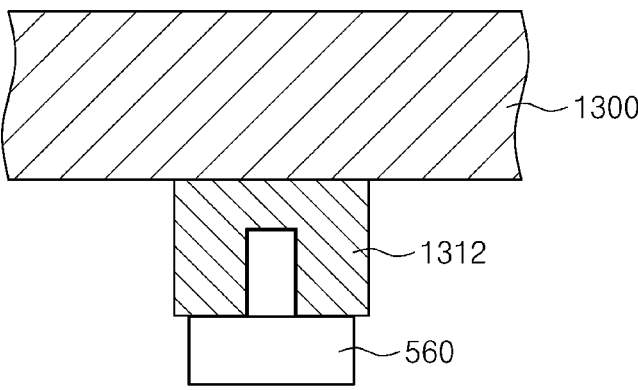
FIG. 8 is a view for explaining a terminal fixing portion.

FIG. 7 is a view for explaining the upper press portion, and FIG. 8 is a view for explaining the terminal fixing portion.

Referring to FIGS. 5 to 8, the upper press portion 1300 is disposed in the inner space of the chamber 1100 to face the stage 1200. The upper press portion 1300 may include a heater 1301. During the bonding process, the upper press portion 1300 may be heated to a predetermined temperature. Meanwhile, the upper press portion 1300 may be provided to be vertically movable. The upper press portion 1300 may include terminal fixing portions 1310 for fixing the power terminal. The upper press portion 1300 may be elevated by the elevating driver 1400. The elevating driver 1400 is disposed outside the chamber 1100, and a shaft 1410 of the elevating driver 1400 penetrates an upper wall of the chamber 1100 and is connected to the upper press portion 1300.

The controller 1001 may control the heater 1201 of the stage 1200 and the heater 1301 of the upper press portion 1300.

The bonding apparatus 1000 of the power terminal further includes a guide member 1500. The guide member 1500 guides a vertical movement of the upper press portion 1300. For example, the guide member 1500 may include guide rods 1510 and moving plates 1520 which are fixed and installed vertically in the inner space of the chamber 1100. The moving plate 1520 is fixedly installed on the upper surface of the upper press portion 1300. The guide rod 1510 is connected to an edge of the moving plate 1520.

The terminal fixing portion 1310 may include a magnetic holder 1312 for fixing the power terminal 560 by a magnetic force. The terminal fixing portion 1310 may be provided on the bottom surface of the upper press portion 1300 to correspond to the terminal pads 555 of the heating plate 550 placed on the stage 1200. The magnetic holder 1312 may be a permanent magnet or an electromagnet. The magnetic holder 1312 has a shape corresponding to an upper shape of the power terminal 560 such that the power terminal 560 is stably fixed thereto.

The bonding method for the power terminal in the bonding device 1000 of the power terminal of the heating plate with the aforementioned configuration may include a step of providing an object to be bonded and a bonding step. In the step of providing the object to be bonded, the heating plate 550 is placed on the stage 1200, and the power terminals 560 are attached to the magnetic holder 1312 of the upper press portion 1300.

Figure 9:
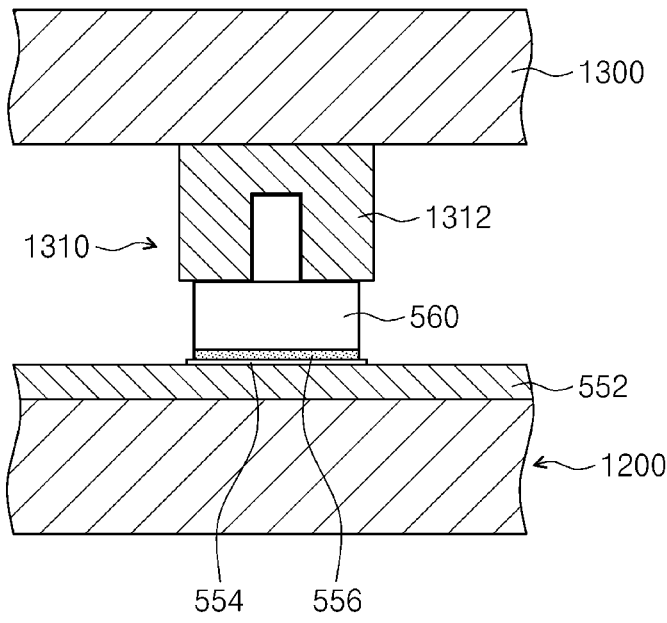
FIG. 9 is a view for explaining a bonding process of a power terminal.

In the bonding step, the power terminals 560 are sintered on the heating plate 550 by thermal compression. As illustrated in FIG. 9, in the bonding step, the upper press portion 1300 is pressed in a stage direction. In the bonding step, after performing a first treatment at a first setting temperature, a second treatment is performed at a second set temperature different from the first set temperature. In this case, a pressing force may remain at 5 MPa. For example, the first set temperature may be 70 to 90° C., and the second set temperature may be 290 to 310° C. The time taken for the second treatment may be longer than the time taken for the first treatment. For example, the time taken for the first treatment may be 20 minutes, and the time for the second time may be 30 minutes. The controller 1001 controls the temperature of the stage 1200 and the upper press portion 1300 such that while the power terminal 560 is thermally compressed by the press portion 1300 to the terminal pad 556, the first treatment is performed at the first set temperature and then the second treatment is performed at the second set temperature different from the first set temperature.

As described above, the bonding method for the power terminal of the present invention can improve degradation characteristics of bonding parts of the terminal by applying a bonding material and process with excellent high temperature durability. For example, since an Ag sintered bonding does not form intermetallic compounds as compared to soldering, voids or cracks do not occur at a bonding interface, and since the Ag sintered bonding is a homogeneous solid solution bonding, it is stable at a high temperature.

Figure 10:
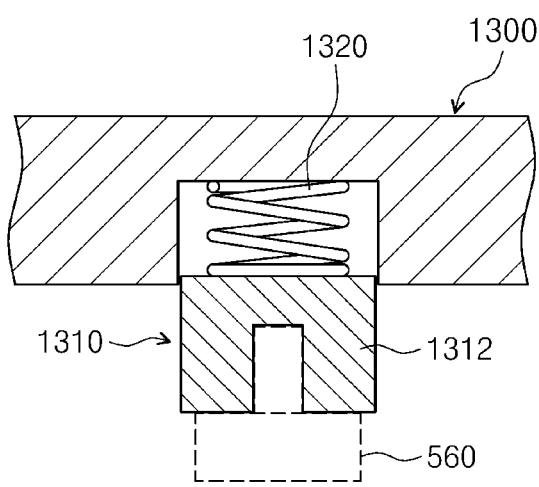
FIG. 10 is a view illustrating another embodiment of the terminal fixing portion.

FIG. 10 is a view illustrating another embodiment of the terminal fixing portion.

Referring to FIG. 10, the terminal fixing portion may provide a pressing force to the power terminal in a state where the magnetic holder is elastically supported by the upper press portion. To this end, the terminal fixing portion may include an elastic body elastically supporting the magnetic holder.

As described above, when the bonding process of the power terminal is performed in a state where the magnetic holder of the terminal fixing part is elastically supported by the elastic body, a pressure dispersion deviation can be minimized and the pressing force applied to each of the power terminals can be uniformly supplied.

The foregoing detailed description illustrates the present invention. In addition, the above description shows and describes the exemplary embodiments of the present invention, and the present invention may be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. In addition, the appended claims should be construed to include other exemplary embodiments as well.

What is claimed is:

1. A bonding apparatus for a power terminal of a heating plate, for bonding the power terminal supplying power to a heating wire of a substrate, the apparatus comprising:
    a chamber;
    a stage which is disposed in an inner space of the chamber and on which the substrate is placed;
    an upper press portion disposed in the inner space of the chamber to face the stage, provided to be vertically movable, and having a terminal fixing portion configured to fix the power terminal; and
    an elevating driver configured to move the upper press portion up and down, wherein the terminal fixing portion includes a magnetic holder and provides a pressing force to the power terminal in a state in which the magnetic holder is elastically supported by the upper press portion.

2. The bonding apparatus for a power terminal of a heating plate of claim 1, wherein the magnetic holder fixes the power terminal by a magnetic force.

3. The bonding apparatus for a power terminal of a heating plate of claim 2, wherein the terminal fixing portion includes an elastic body that elastically supports the magnetic holder.

4. The bonding apparatus for a power terminal of a heating plate of claim 1, wherein the stage and the upper press portion further include a heating member.

5. The bonding apparatus for a power terminal of a heating plate of claim 4, further comprising a controller configured to control the heating member,
    wherein the controller controls the heating member so as to perform a first treatment at a first set temperature and then a second treatment at a second set temperature different from the first set temperature while the power terminal is thermally compressed to the heating wire by the upper press portion.

6. The bonding apparatus for a power terminal of a heating plate of claim 5, wherein the first set temperature is 70 to 90° C., and the second set temperature is 290 to 310° C.

7. The bonding apparatus for a power terminal of a heating plate of claim 1, further comprising a guide member configured to guide a vertical movement of the upper press portion.

8. The bonding apparatus for a power terminal of a heating plate of claim 7, wherein the guide member includes:
    guide rods fixed and installed vertically in the inner space of the chamber; and
    a moving plate fixedly installed on an upper surface of the upper press portion and provided to be movable along the guide rods.

9. A bonding apparatus for a power terminal of a heating plate, for bonding the power terminal supplying power to a heating wire of a substrate, the apparatus comprising:
    a chamber;
    a stage which is disposed in an inner space of the chamber and on which the substrate is placed;
    an upper press portion disposed in the inner space of the chamber configured to face the stage, provided to be vertically movable, and having a terminal fixing portion configured to fix the power terminal;
    a guide member configured to guide a vertical movement of the upper press portion; and
    an elevating driver configured to move the upper press portion up and down,
    wherein the terminal fixing portion further includes;
    a magnetic holder configured to hold the power terminal by a magnetic force, and
    an elastic body that elastically supports the magnetic holder in the upper press portion.

10. The bonding apparatus for a power terminal of a heating plate of claim 9, wherein the stage and the upper press portion further include a heating member.

11. The bonding apparatus for a power terminal of a heating plate of claim 10, further comprising a controller configured to control the heating member,
    wherein the controller controls the heating member so as to perform a first treatment at a first set temperature and then a second treatment at a second set temperature different from the first set temperature while the power terminal is thermally compressed to the heating wire by the upper press portion.

12. A bonding apparatus for a power terminal of a heating plate, for bonding the power terminal supplying power to a heating wire of a substrate, comprising:
    a chamber;
    a stage disposed in an inner space of the chamber and on which the substrate is placed;
    an upper press portion disposed in the inner space of the chamber to face the stage, configured to be vertically movable, and having a terminal fixing portion including a magnetic holder configured to fix the power terminal by a magnetic force, and an elastic body that elastically supports the magnetic holder; and
    an elevating driver configured to move the upper press portion up and down.

13. The bonding apparatus for a power terminal of a heating plate of claim 12, wherein the stage and the upper press portion further include a heating member.

14. The bonding apparatus for a power terminal of a heating plate of claim 13, further comprising a controller configured to control the heating member,
    wherein the controller controls the heating member so as to perform a first treatment at a first set temperature and then a second treatment at a second set temperature different from the first set temperature while the power terminal is thermally compressed to the heating wire by the upper press portion.

15. The bonding apparatus for a power terminal of a heating plate of claim 14, wherein the first set temperature is 70 to 90° C., and the second set temperature is 290 to 310° C.

16. The bonding apparatus for a power terminal of a heating plate of claim 12, further comprising a guide member configured to guide a vertical movement of the upper press portion.

17. The bonding apparatus for a power terminal of a heating plate of claim 16, wherein the guide member includes:

guide rods fixed and installed vertically in the inner space of the chamber; and a moving plate fixedly installed on an upper surface of the upper press portion and provided to be movable along the guide rods.

* * * * *